United States Patent [19]

Tarui et al.

[11] Patent Number: 5,059,808
[45] Date of Patent: Oct. 22, 1991

[54] ALIGNMENT METHOD FOR PATTERNING

[75] Inventors: Atsushi Tarui; Kazuhiko Urayama; Yutaka Kamata, all of Yokohama, Japan

[73] Assignee: Kabushiki Kaisha Toshiba, Kawasaki, Japan

[21] Appl. No.: 547,332

[22] Filed: Jul. 3, 1990

Related U.S. Application Data

[63] Continuation-in-part of Ser. No. 289,812, Dec. 27, 1988, abandoned.

[30] Foreign Application Priority Data

Dec. 24, 1987 [JP] Japan .................................. 62-328250

[51] Int. Cl.$^5$ ............................................. G01N 21/86
[52] U.S. Cl. ...................................... 250/548; 430/311
[58] Field of Search ..................... 250/548, 557, 216; 356/400, 401; 430/311, 312

[56] References Cited

U.S. PATENT DOCUMENTS

| | | | |
|---|---|---|---|
| 3,885,877 | 5/1975 | Horwath et al. | 356/400 |
| 4,575,399 | 3/1986 | Tanaka et al. | 156/272.8 |
| 4,677,043 | 6/1987 | Cordes et al. | 430/311 |
| 4,681,430 | 7/1987 | Goel et al. | 355/77 |
| 4,702,992 | 10/1987 | Ishii et al. | 430/311 |
| 4,778,739 | 10/1988 | Protschka | 430/325 |

FOREIGN PATENT DOCUMENTS 233056  8/1987  European Pat. Off. .
87/02791  5/1987  World Int. Prop. O. .

Primary Examiner—David C. Nelms
Attorney, Agent, or Firm—Foley & Lardner

[57] ABSTRACT

There is disclosed an alignment method comprising the steps of irradiating an alignment light toward an alignment mark whose surface has a high reflectance, the alignment mark being coated by a resist film, and performing alignment on the basis of the resultant intensity of reflected light from the surface of the resist and reflected light from an interface between the resist and the mark portion. The resist comprises a chemical material having a light absorption characteristic in a wavelength band of the alignment light, and is irrespective of that of an exposure light used to expose the resist.

10 Claims, 5 Drawing Sheets

MALACHILE GREEN

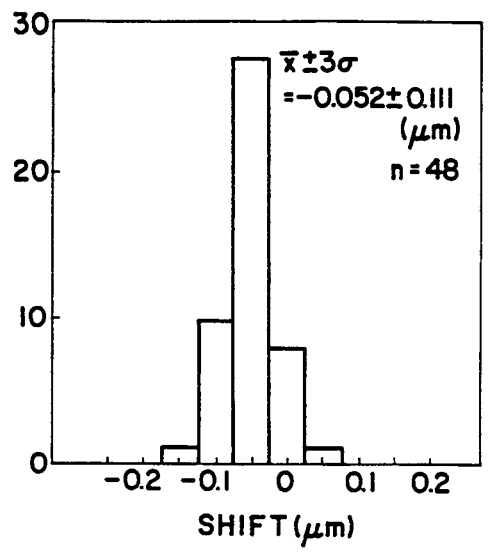
F I G. 9A
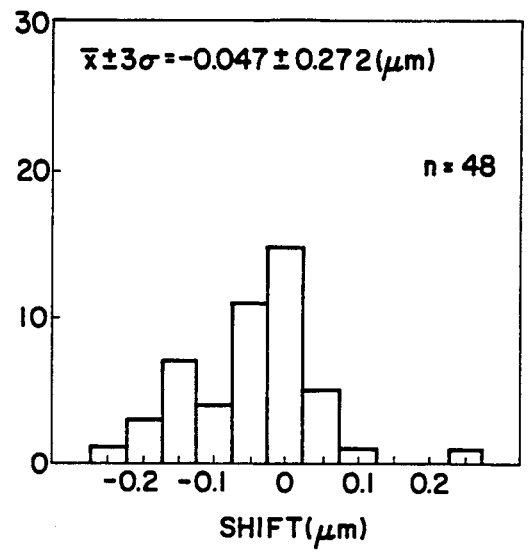
F I G. 9B
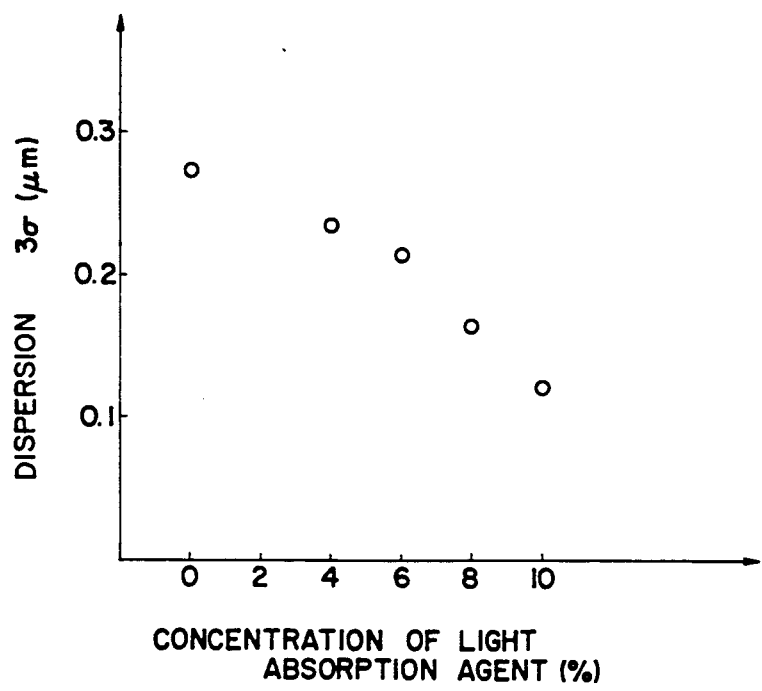
F I G. 10

ALIGNMENT METHOD FOR PATTERNING

This application is a continuation-in-part of application Ser. No. 07/289,812, filed Dec. 27, 1988, now abandoned.

BACKGROUND OF THE INVENTION

This invention relates to an alignment method to irradiate an alignment light onto an alignment mark portion on a photo resist coated semiconductor substrate and to scan it, to therefore align to a photo mask, etc. on the basis of the resultant intensity of rays of reflected light of alignment light respectively reflected by the surface of the photo resist and the interface between the photo resist and the mark portion, and more particularly to an alignment method for the patterning used in the lithographic process for semiconductor devices.

In the manufacture of semiconductor devices, a photolithographic technique is used for forming various wiring, etc. In this lithographic technique, it is required to perform the alignment of a photo mask, etc. for patterning on the basis of positioning marks provided on the semiconductor substrate on which a photo resist is coated.

Conventionally, there are instances where photosensitive resin materials (photo resists) are used with dyes having a light absorption characteristic in the exposure wavelength, etc. being added thereinto with a view to suppressing a reflected light from the base substrate in the exposure process. Rather, resist materials having no light absorption property and excellent transparency are selectively used for the wavelength of an alignment light.

In the case of using such a photo resist, a distorted alignment waveform is likely to occur when a partially damaged mark is used.

This results in the problem that an alignment position obtained by processing such a distorted alignment waveform is apt to be shifted with respect to the true center of the mark, thereby deteriorating the detection reproducibility of the mark.

SUMMARY OF THE INVENTION

Accordingly, an object of this invention is to provide an alignment method capable of improving the alignment accuracy.

According to this invention, there is provided an alignment method comprising the steps of irradiating an alignment beam as an alignment light toward an alignment mark whose surface has a high reflectance, the alignment mark being coated by a resist film, and performing alignment on the basis of the resultant intensity of reflected light from the surface of the resist and reflected light from an interface between the resist and the mark, wherein the resist comprises a chemical material having a light absorption characteristic in a wavelength band of the alignment light, the wavelength band of this alignment light being irrespective of that of an exposure light used to expose the resist. In a preferred embodiment, the alignment method is used to effect the alignment of a mask on a photoresist-coated semiconductor substrate. The alignment mark preferably is provided outside an element area on the semiconductor substrate.

In accordance with an alignment method according to this invention thus featured, since a chemical material having a conspicuous light absorption characteristic in the wavelength band of an alignment light is added to a resist, the intensity of the alignment light reflected by the interface between the resist and the mark portion is lowered. The difference between the maximum and minimum values of the resultant intensity of the reflected light therefore becomes smaller than that in the prior art method, and the resultant intensity of the reflected light does not change to any great extent with respect to very small changes in the film thickness of the resist, resulting in a distortionless and stable alignment waveform.

The chemical material added in the resist has a light absorption characteristic in a wavelength band which is irrespective of wavelength bands of the alignment light and exposure light. This means that the alignment light beam may cause a chemical change in the resist. However, since the alignment marks are disposed in the area outside of the element area, no problems arise due to this charge.

Accordingly, the alignment method of this invention can improve the alignment accuracy.

BRIEF DESCRIPTION OF THE DRAWINGS

In the accompanying drawings:

FIGS. 9A and 9B are histograms showing shifts with respect to the true position of measured results of alignment positions when a light absorption agent is added into a resist, and when no light absorption agent is added thereto, respectively;

FIG. 10 is a graph showing the standard deviation of shifts with respect to the true positions of measured results of alignment positions when the density of a light absorption agent to be added to a resist is changed.

DESCRIPTION OF THE PREFERRED EMBODIMENT

Prior to the description of an embodiment of this invention, the problems with the prior art will be described in detail.

Figure 1:
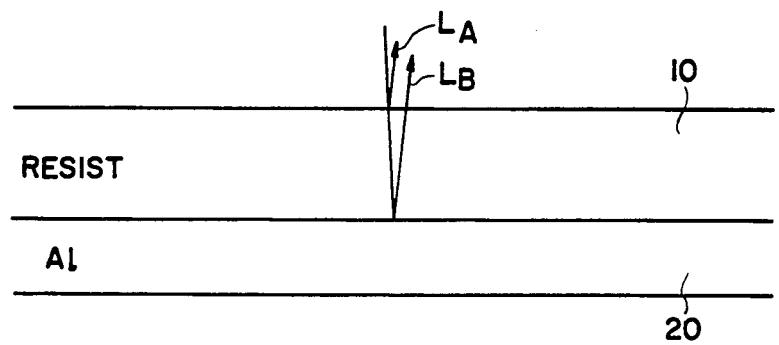
FIG. 1 is a view showing the state of reflection when an alignment light is irradiated onto a substrate having a resist film formed on an aluminum film.

The state of reflection of an alignment light when an alignment light is irradiated onto a substrate having a resist layer 10 coated on an aluminum layer 20, is shown in FIG. 1.

In FIG. 1, when an alignment light is irradiated onto the resist layer 10, a part thereof is reflected on the surface of the resist layer 10, resulting in a reflected light $L_A$, but the remainder is transmitted through the resist layer 10 and is then reflected at the interface between the resist layer 10 and the aluminum layer 20. The light thus obtained is transmitted through the resist layer 10 and reaches the air for a second time. When it is assumed that the intensity of the alignment light is $I_o$, the reflection power on the surface of the resist layer 10 is a, and the transmission factor at the interface between the resist layer 10 and the aluminum layer 20 is b, the reflected light $L_A$ reflected on the surface of the resist layer 10 is expressed as $a \cdot I_o$. The light thus obtained is transmitted through the resist layer 10 and is then reflected at the interface between the resist layer 10 and the aluminum layer 20. This reflected light is transmitted through the resist layer 10 for a second time and reaches the air. The intensity $I_B$ of the reflected light $L_B$ is expressed as $bt^2 I_o$. Accordingly, the resultant intensity I of the reflected light $L_A$ reflected on the surface of the resist layer 10 and the reflected light $L_B$ reflected at the interface reaching the air is expressed by the equation (1).

$$I = I_A + I_B + 2\sqrt{I_A \cdot I_B} \cos(\theta_1 - \theta_2) \\ = I_O \{a + bt^2 + 2t\sqrt{a \cdot b} \cos(\theta_1 - \theta_2)\} \quad (1)$$

where $\theta_1$ shows a phase on the surface of the resist layer 10 of the reflected light $L_A$, and $\theta_2$ shows a phase on the surface of the resist layer 10 of the reflected light $L_B$.

Figure 2:
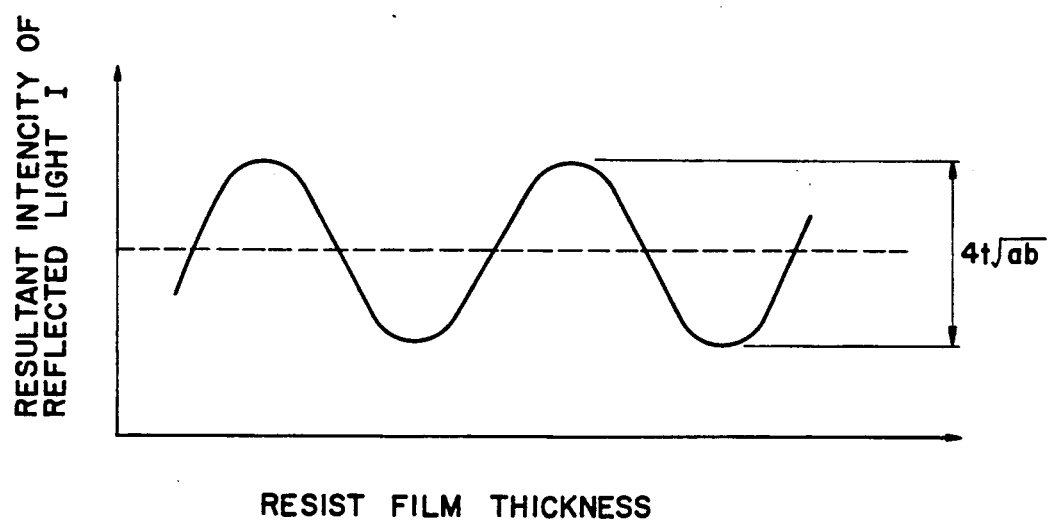
FIG. 2 is a graph showing changes in the resultant intensity of a reflected light of an alignment light with respect to the thickness of resist film.

Thus, alignment is carried out on the basis of the resultant intensity I of these reflected lights $L_A$ and $L_B$. On the other hand, since the film thickness of the resist layer 10 has a linear relationship with respect to the phase difference $(\theta_1 - \theta_2)$, the resultant intensity I of the reflected lights $L_A$ and $L_B$ with respect to the film thickness of the resist layer 10 is given by a sinusoidal curve shown in FIG. 2. Namely, the resultant intensity I is expressed as a sinusoidal curve having a mean value of $I_o(a+bt^2)$ and an amplitude of $2t\sqrt{a \cdot b}$. The maximum value $I_{max}$ and the minimum value $I_{min}$ of the resultant intensity I are defined by the following equations, respectively:

$$I_{max} = I_o(\sqrt{a} + t\sqrt{b})^2 \quad (2)$$

$$I_{min} = I_o(\sqrt{a} - t\sqrt{b})^2 \quad (3)$$

Accordingly, the full amplitude $4t\sqrt{a \cdot b}$ of the resultant intensity I of the reflected lights $L_A$ and $L_B$ when the mark portion for alignment is formed by a material having a large reflection power such as aluminum, is larger than that when the same portion is formed by a material having a small reflection power. The resultant intensity, therefore, varies to a great extent with respect to very small changes in the film thickness of the resist layer 10.

Figure 3A:
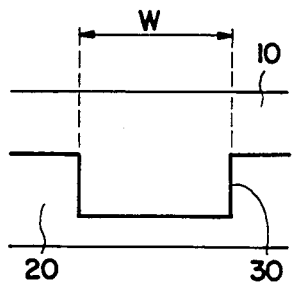
FIGS. 3A, 3B and 3C are cross sectional views showing forms of the alignment marks.
Figure 3B:
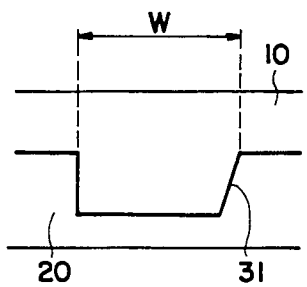
Figure 3C:
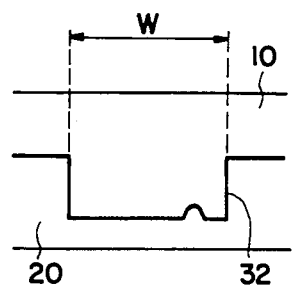
Figure 4A:
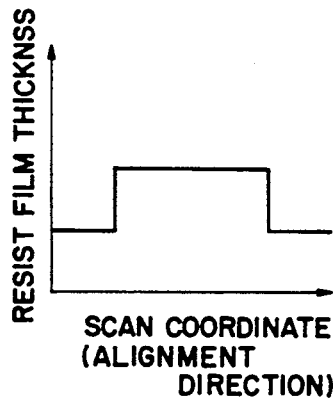
FIGS. 4A, 4B and 4C are graphs showing the thicknesses of the marks shown in FIGS. 3A, 3B and 3C, respectively.
Figure 5A:
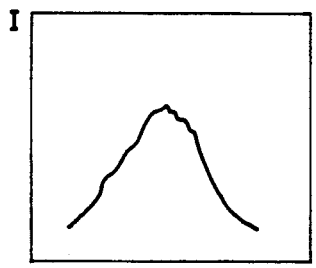
FIGS. 5A, 5B and 5C are graphs showing alignment waveforms when a conventional method is used.

For example, even if a mark 30 formed on the aluminum layer 20 is formed planar at one view and therefore seems normal as shown in FIG. 3A, the film thickness of the resist layer 10 formed thereon varies to an extremely small extent. For this reason, when an alignment light having a beam width of, e.g., 2.5 μm is irradiated onto a mark 30 having a width W of 4 μm shown in FIG. 3A to conduct scanning from the left to the right, because the film thickness of the resist layer 10 has a shape shown in FIG. 4A, the resultant waveform of rays of reflected light reflected by the surface of the resist layer 10 and the interface between the resist layer 10 and the aluminum layer 20, becomes an alignment waveform distorted as shown in FIG. 5A. The cross section of the mark 31 inclined on one side is shown in FIG. 3B. The cross section of the partially defected mark 32 is shown in FIG. 3C.

Figure 4B:
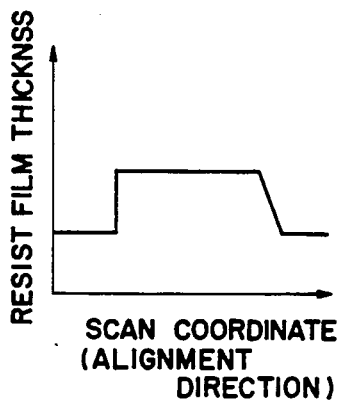
Figure 4C:
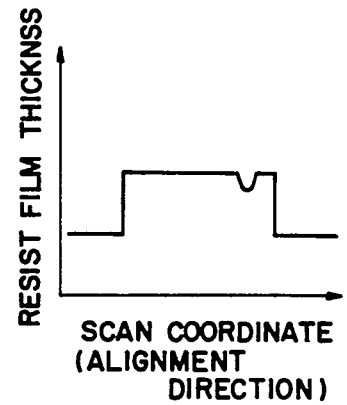
Figure 5B:
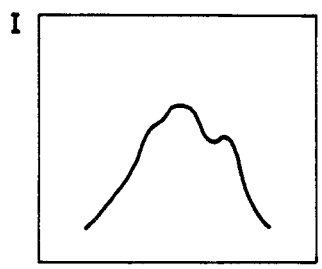
Figure 5C:
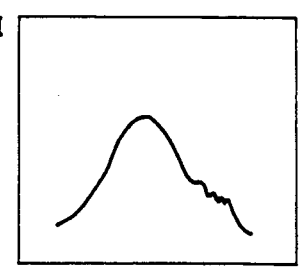

When an alignment is implemented to such marks 31 and 32, resist films formed on the marks 31 and 32 have shapes shown in FIGS. 4B and 4C, respectively. For the same reason as the above-described one, alignment waveforms of the marks 31 and 32 become alignment waveforms as shown in FIGS. 5B and 5C, respectively. It has been stated elsewhere that a shift in waveform is likely to occur in the case of such waveforms.

Figure 11:
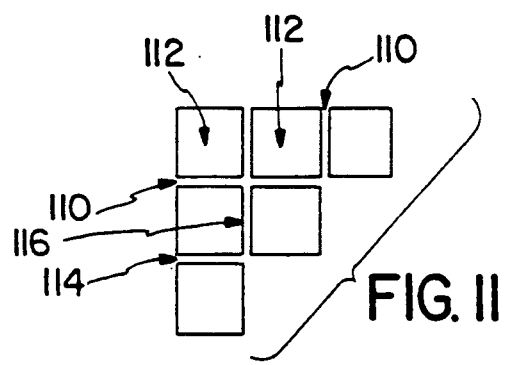
FIG. 11 is a plan view.
Figure 12A:
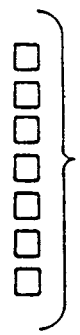
FIG. 12A and 12B are partial enlarged views showing locations and configurations of alignment marks.
Figure 12B:

As shown in FIG. 11 and FIG. 12, alignment marks are provided in dicing areas 110 which are located between chip areas 112. Alignment marks 114 used for alignment along the x-axis include a plurality of fine squares arranged in the y-direction. Similarly, alignment marks 116 used for alignment along the y-axis include a plurality of fine squares arranged in the x-direction.

The alignment light is directed only to these alignment marks. For this purpose, the alignment light is limited using a mask having a window in order not to expose the chip areas.

When an alignment light beam having a wavelength band to which the resist is also sensitive is used, the resist on the alignment mark is exposed. However, this does not cause any adverse effect for the completed semiconductor device, because the alignment marks will be removed in the dicing process.

Figure 6:
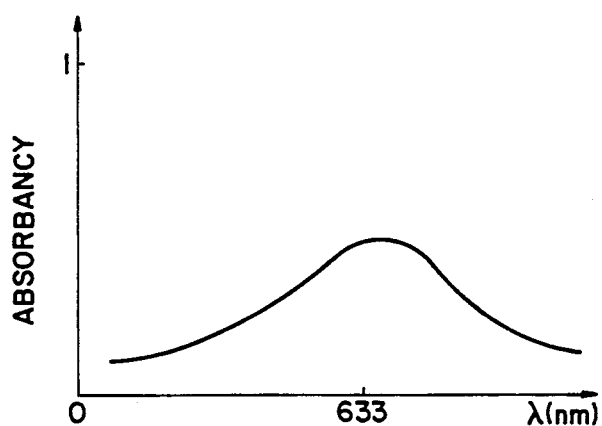
FIG. 6 is a graph showing the light absorption characteristic of a light absorption agent (malachite green)
Figure 7:
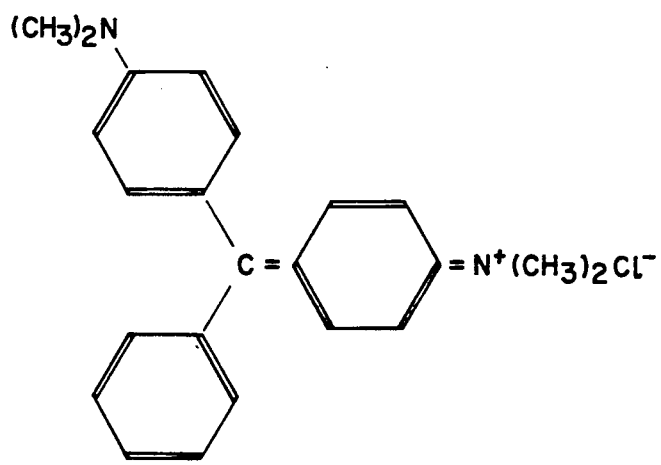
FIG. 7 is a model view showing the chemical structure of a light absorption agent (malachite green)

An embodiment of this invention will be described in connection with the example where a He-Ne laser ($\lambda = 633$ nm) is used for the alignment light, and a light absorption agent having the trade name of malachite green (manufactured by Hodogaya Chemical Industries) is added to a resist having a trade name of OFPR 800 (manufactured by Tokyo Ohka Industries). The light absorption characteristic of the resist (OFPR 800) to which malachite green is added, is shown in FIG. 6. It is seen from FIG. 6 that the absorbance has a peak at a wavelength of about 633 nm, and that a laser beam of the He-Ne laser ($\lambda = 633$ nm) is excellently absorbed. The chemical structure of malachite green is shown in FIG. 7 for reference.

Figure 8A:
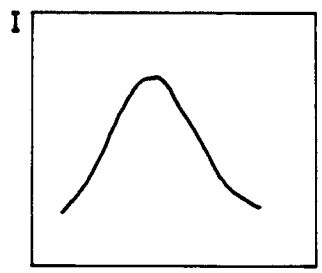
FIGS. 8A, 8B and 8C are graphs showing alignment waveforms when an alignment method according to this invention is used.
Figure 8B:
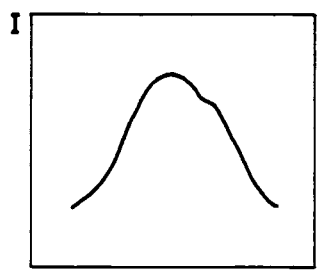
Figure 8C:
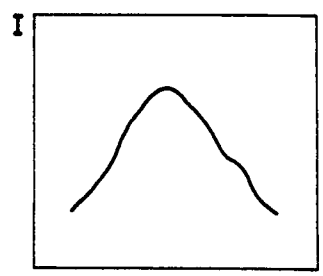

The alignment waveforms when an alignment is implemented to marks 30, 31 and 32 shown in FIGS. 3A, 3B and 3C using such a resist to which a chemical material having a remarkable absorption characteristic in the wavelength band of the alignment light is added, are shown in FIGS. 8A, 8B and 8C, respectively. As seen from FIGS. 8A, 8B and 8C, stable alignment waveforms can be obtained. This is considered to result from the fact that the alignment light is considerably absorbed by the chemical material added to the resist, whereby the intensity of reflected light at the boundary surface between the mark portion and the resist reduces to result in suppression of a sudden change of the resultant intensity of the reflected light with respect to extremely small changes of the film thickness of resist.

Shifts with respect to the true positions of alignment positions obtained by processing alignment waveforms thus obtained are shown as a histogram in FIG. 9A.

In this histogram, the number n of measured alignment positions is 48 and the class sectional width of the abscissa is taken as 0.05 μm. It is seen from this histogram that the majority of shifts in the measured alignment positions are distributed in sections from −0.075 to −0.025 μm. It is to be noted that the mean value $\bar{x}$ of shifts with respect to the true positions of measured results at this time was −0.052 μm, and the value $3\sigma$ ($\sigma$ represents the standard deviation) indicative of the state of dispersion was 0.111 μm.

Furthermore, shifts with respect to the true positions of the measured results of alignment positions when an alignment is implemented with no light absorption agent malachite green being added to the resist (ORPR 800), are shown as a histogram in FIG. 9B. In the histogram of FIG. 9B, the number n of measured alignment positions is 48, and is the same number as that in the histogram of FIG. 9A, where the class sectional width of the abscissa is taken as 0.05 μm. It is seen from this histogram that shifts of the measured alignment positions are distributed over classes of a considerably broad range. It is to be noted that the mean value $\bar{x}$ with respect to the true positions of measured results at this time was −0.047 μm and the value $3\sigma$ indicative of the state of dispersion was 0.272 μm. As seen from the measured results shown in FIGS. 9A and 9B, the value $3\sigma$ indicative of the state of dispersion when a light absorption agent (malachite green) having an excellent light absorption characteristic with respect to the wavelength of the alignment light (He-Ne laser) is added to the resist (OFPR 800) becomes smaller than that when such a light absorption agent is not added thereto, thus making it possible to carry out highly accurate alignment.

Changes in the value $3\sigma$ indicative of the state of dispersion of shifts with respect to the true positions of measured alignment positions when the concentration of the light absorption agent added to the resist (OFPR 800) is changed so that it is equal to 0, 4, 6, 8 and 10%, are shown in FIG. 10. It is seen from FIG. 10 that the value of $3\sigma$ becomes small accordingly, as the concentration of the light absorption agent increases. The measured result of FIG. 9A shows that the concentration of the light absorption agent (malachite green) added is 10%.

As just described above, an alignment method according to this embodiment is devised to add the additive having an excellent light absorption characteristic with respect to the wavelength of the alignment light to the resist (OFPR 800), thereby making it possible to improve the alignment accuracy.

It is to be noted that malachite green is used as an additive because the laser beam of He-Ne laser (λ=633 nm) is used for the alignment light in the above-described embodiment, but this invention is not limited to such an implementation. If an additive conforming to the wavelength of an alignment light is used, the same advantages can be obtained. Generally, a light beam having a wavelength of 365 nm or 436 nm is used as an exposure light in the exposure process. According to the present invention, the alignment light can have these wavelength components. In addition, where the beam of a He-Ne laser is used for an alignment light, if one of spiro compound, nitro compound, azo compound, quinone compound, diphenylmethane compound, polymethin compound and acridine compound is used instead of a triphenylmethene compound such as green for an additive, the same advantages can be obtained.

What is claimed is:

1. An alignment method comprising the steps of:
   irradiating a He-Ne laser beam as an alignment light toward an alignment mark whose surface has a high reflectance, said alignment mark being provided on a semiconductor substrate and being coated by a resist film, and
   performing alignment on the basis of the resultant intensity of reflected light from the surface of said resist and reflected light from an interface between said resist and said mark,
   wherein said resist comprises a chemical material having a light absorption characteristic in a wavelength band of said alignment light, said wavelength band of said alignment light being irrespective of that of an exposure light used to expose said resist.

2. An alignment method as claimed in claim 1, wherein said chemical material is selected form the group consisting of a spiro compound, a nitro compound, an azo compound, a triphenylmethane compound, a quinone compound, a diphenyl compound, a polymenthin compound and an acridine compound.

3. An alignment method as claimed in claim 1, wherein said alignment mark is made of aluminum.

4. An alignment method comprising the steps of:
   irradiating an alignment beam as an alignment light toward an alignment mark whose surface has a high reflectance, said alignment mark being coated by a resist film, and
   performing alignment on the basis of the resultant intensity of reflected light from the surface of said resist and reflected light from an interface between said resist and said mark,
   wherein said resist comprises a chemical material having a light absorption characteristic in a wavelength band of said alignment light, said wavelength band of said alignment light being irrespective of that of an exposure light used to expose said resist.

5. An alignment method as claimed in claim 4, wherein said chemical material is selected from the group consisting of a spiro compound, a nitro compound, an azo compound, a triphenylmethane compound, a quinone compound, a diphenyl compound, a polymenthin compound and an acridine compound.

6. An alignment method as claimed in claim 4, wherein said alignment mark is provided outside an element area on a semiconductor substrate.

7. An alignment method as claimed in claim 6, wherein said alignment mark is provided on a dicing line area to be cut by dicing.

8. An alignment method as claimed in claim 4, wherein said alignment mark is made of aluminum.

9. An alignment method as claimed in claim 4, wherein said alignment light is a laser beam of a He-Ne laser.

10. An alignment method as claimed in claim 4, wherein said alignment light is an exposure light.

* * * * *